United States Patent [19]

Stitt et al.

[11] Patent Number: 4,616,188
[45] Date of Patent: Oct. 7, 1986

[54] HALL EFFECT ISOLATION AMPLIFIER

[75] Inventors: Robert M. Stitt; Rodney T. Burt, both of Tucson, Ariz.

[73] Assignee: Burr-Brown Corporation, Tucson, Ariz.

[21] Appl. No.: 746,860

[22] Filed: Jun. 20, 1985

[51] Int. Cl.⁴ .................... H03F 15/00; G01R 33/00
[52] U.S. Cl. .................................... 330/6; 324/117 H
[58] Field of Search ...................... 330/6; 324/117 H; 338/32 H; 307/309; 323/294, 368

[56]  References Cited
U.S. PATENT DOCUMENTS 4,283,643  8/1981  Levin ................................. 323/368

Primary Examiner—James B. Mullins
Assistant Examiner—G. Wan
Attorney, Agent, or Firm—Harry M. Weiss & Associates

[57] ABSTRACT

An isolation amplifier circuit is described that utilizes a magnetic field in combination with a Hall effect device to isolate input signals and output signals. The input signal is applied to a conducting coil that produces a magnetic field in a Hall effect material through which current is flowing. Because of the Hall effect, terminals on the sides of the Hall effect material can provide a voltage difference. This voltage difference is amplified and applied to a second conducting coil. The second conducting coil is adapted to provide a magnetic field in the opposite direction from the magnetic field produced by the input signal. When the magnetic fields are identical, no difference in current flowing through the two terminals will be present. The output signal of the difference amplifier circuit will be a function of the input signal. According to a second embodiment, apparatus is included for cancelling ambient magnetic fields. A second isolation amplifier circuit is arranged to have a spatial orientation rotated 180° from a first isolation amplifier. With this configuration, ambient magnetic fields will have cancelling effects. The Hall effect device can be implemented in a PNP transistor with a split collector. The isolation amplifier can be fabricated with monolithic technology.

21 Claims, 4 Drawing Figures

HALL EFFECT ISOLATION AMPLIFIER

BACKGROUND OF THE INVENTION

1. Field of the Invention

This invention relates generally to amplifying circuits and, more particularly, to amplifying circuits, referred to as isolation amplifier circuits, for which an input signal must be electrically isolated from an output signal.

2. Discussion of the Related Art

An isolation amplifier circuit is used to isolate a dc component of an input signal from a dc component of an output signal. Two general types of isolation amplifier circuits are currently in use. In one of the types of amplifier circuits, the input signal is electrically isolated from the output signal by means of a transformer circuit. The transformer circuit is popular because of the well-known design characteristics. However, because of the unacceptable low frequency and DC components, the transformer provides only limited usefulness in the isolation amplifier circuit application. This limitation can be overcome by modulation of the input signal applied to the input terminals of the transformer and reconstruction of the output signal at the output terminals of the transformer. This procedure provides a low frequency compensation, but at the expense of degradation of high frequency performance. While complex circuits can be devised to provide appropriate response in both frequency ranges, the result becomes a circuit of increasing complexity and expense. A second common technique is the use of an optical coupler by which a light-emitting diode produces electromagnetic radiation. The radiation is then detected by a photosensitve diode. The optical coupling apparatus is relatively expensive and typically requires a power supply to activate the light-emitting diode of the input circuit.

A need has therefore been felt for a isolation amplifier circuit which would be responsive to the low frequency signals and which would still provide complete electrical isolation between the input signal and the output signal.

SUMMARY OF THE INVENTION

It is therefore an object of the present invention to provide an improved isolation amplifier circuit.

It is yet another object of the present invention to provide an isolation amplifier circuit that is responsive to low frequency signals as well as high frequency signals.

It is another object of the present invention to provide apparatus and method for an isolation amplifier circuit utilizing the Hall effect.

It is yet another object of the present invention to use a split-collector semiconductor device as a Hall effect detector in an isolation amplifier circuit.

It is yet another object of the present invention to provide a plurality of isolation amplifier circuits utilizing the Hall effect, the isolation amplifer circuits arranged to cancel the effects of ambient magnetic fields.

It is yet a further object of the present invention to provide a technique for fabrication of monolithic isolation amplifiers.

It is a still further object of the present invention to provide an isolation amplifier that does not require a power supply for the signal input portion of the isolation amplifier.

The aforementioned and other objects are accomplished, according to the present invention, by a input configuration of conductors for applying a magnetic field, determined by an input signal, to a Hall effect device. The Hall effect device provides a signal that can be applied to an amplifying circuit. The amplifying circuit applies an output signal to a configuration of conductors that generates a compensating magnetic field at the Hall effect device. The amplifying circuit, with the magnetic field feedback loop, compensates for the magnetic field produced by the input signal at the Hall effect device. The Hall effect detector can include a split-collector semiconductor device positioned so that the current between the emitter and the collector terminals can be influenced by the magnetic field. In the preferred embodiment, a plurality of these detectors are coupled with a spatially inverted orientation. The spatially inverted orientation provides for the summing of the signal produced by the input magnetic field while cancelling the effect of ambient magnetic fields. In the preferred embodiment, the collectors of the semiconductor Hall effect device magnetic field detectors can be coupled to a current mirror, the current mirror having an output signal coupled to an amplifying circuit for controlling the magnetic field feedback and for providing a circuit output signal.

These and other features of the invention will be understood upon reading of the following description along with the drawings.

DESCRIPTION OF THE PREFERRED EMBODIMENT

Detailed Description of the Drawings

Figure 1:
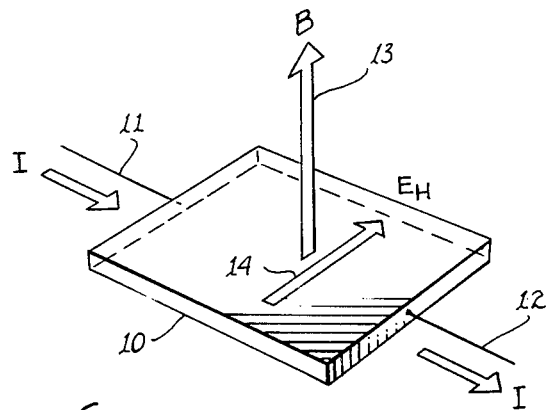
FIG. 1 is a schematic view of the Hall effect phenomena.

Referring now to FIG. 1, an appropriate material 10 has a current applied through the material 10 by terminals 11 and terminals 12. Simultaneously, with the application of the current, a magnetic field 13 of strength B is introduced generally perpendicularly to the flow of the current through the generally planar geometry of material 10. An electric field 14 is generated by the interaction of the magnetic with the charge carriers in the substrate 10.

Figure 2:
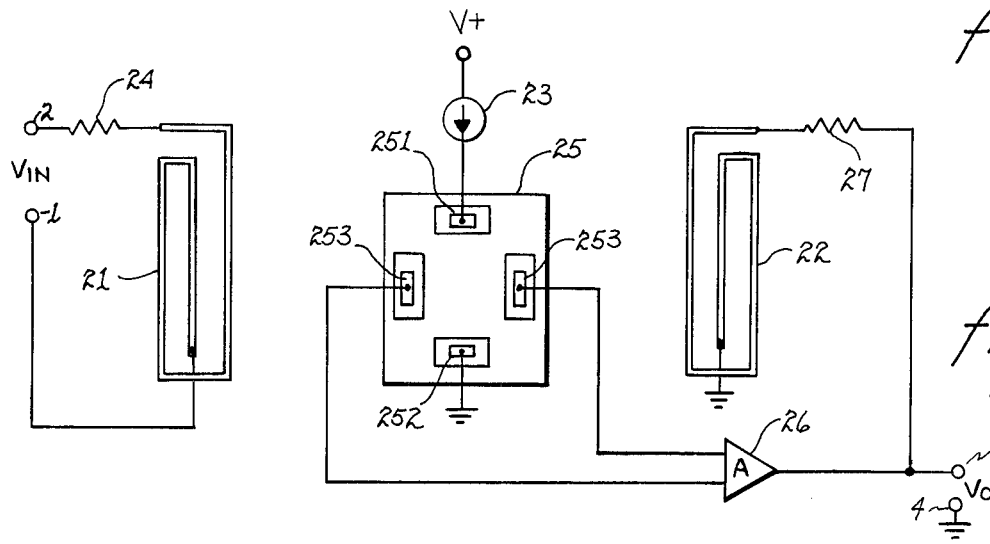
FIG. 2 is a schematic diagram of the method by which a magnetic field detecting Hall effect device can be used as an isolation amplifier according to the present invention.

Referring next to FIG. 2, an input signal $V_{in}$ is applied between two terminals, terminal 1 and terminal 2. Terminal 2 couples the input signal through resistor 24 to a first terminal conducting lead configuration 21, while terminal 1 couples the input signal to a second terminal of the conducting lead configuration 21. A current source 23 is coupled to a power supply voltage, V+, and a current is applied to a terminal 251 in the Hall effect device 25. Terminal 252 of Hall effect device 25 is coupled to the ground potenital. The two terminals on either side of the current flow 253' and 253 are each applied to an input terminal of a differential amplifier 26. The differential amplifier 26 has an output terminal coupled through resistor 27 to a first terminal of conducting lead configuration 22, the second terminal of the conducting lead configuration 22 being coupled to the ground potential. The output terminal of differential amplifier 26 has the output signal of the isolation amplifier, $V_{out}$, applied between output terminal 3 and output terminal 4, output terminal 4 being coupled to the ground or common potential.

Figure 3:
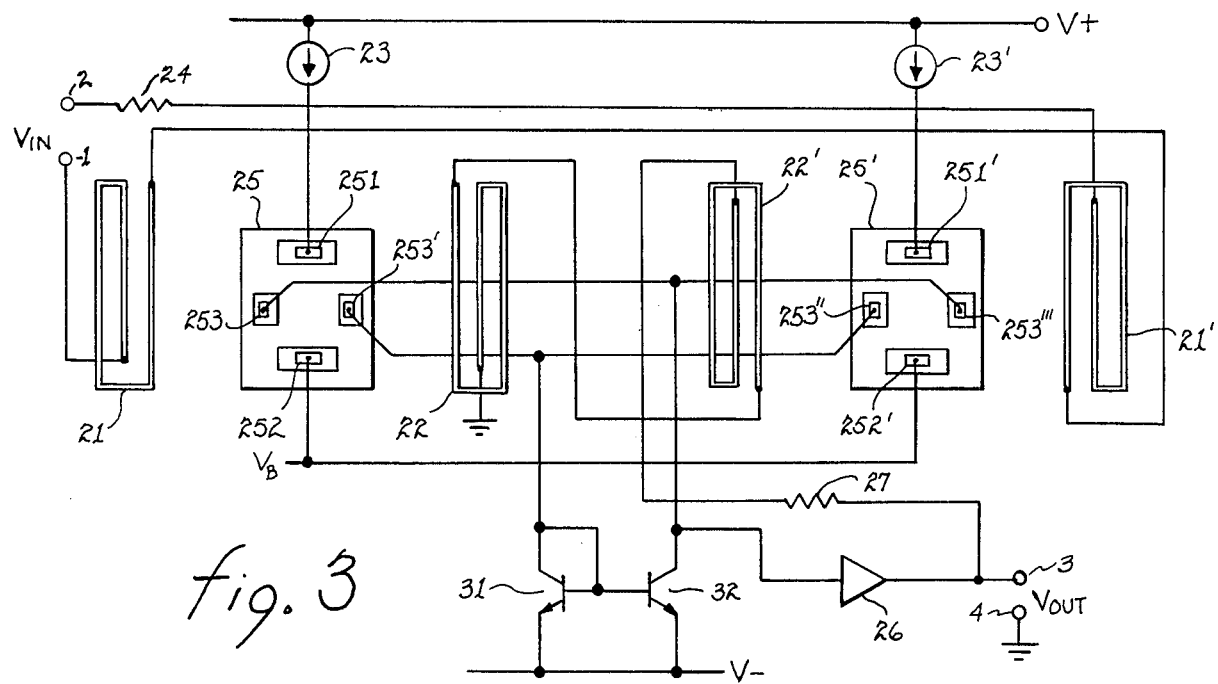
FIG. 3 is a schematic diagram of the use of two Hall effect devices configured in a manner to cancel the effects of ambient magnetic fields according to the present invention.

Referring now to FIG. 3, an input signal, $V_{in}$, is applied to input terminals 1 and 2. Terminal 1 is coupled to a second terminal of conducting lead configuration 21, while a first terminal of conducting lead configuration 21 is coupled to a first terminal of conducting lead configuration 21'. A second terminal of conducting lead configuration 21' is coupled to the input signal, $V_{in}$, through resistor 24, by means of terminal 2. Current source 23 is coupled to the positive supply voltage source, V+, and applies current to terminal 251 of Hall effect device 25. The current from terminal 252 of the Hall effect device 25 is coupled to a supply voltage $V_B$. A second current source 23' is coupled to the positive voltage supply, V+, and is applied to terminal 251' of Hall effect device 25'. Terminal 252' of Hall effect device 25' is coupled to voltage supply $V_B$. Terminal 253 of Hall effect 25 is coupled to terminal 253''' of Hall effect device 25', while the terminal 253' of Hall effect device 25 is coupled to terminal 253'' of Hall effect device 25'. The terminal 253 of the Hall effect device 25 and terminal 253''' are coupled also to an input terminal of amplifier 26 and are coupled to a collector terminal of transistor 32. The emitter of transistor 32 is coupled to a negative supply voltage, −V, while the base of transistor 32 is coupled to the base of transistor 31 and to the collector of transistor 31. The emitter of transistor 31 is coupled to the negative supply voltage, −V. The collector of transistor 31 is coupled to terminal 253'' of the Hall effect device 25' and to terminal 253' of the Hall effect device 25. The output terminal of amplifier 26 supplies the output signal $V_{out}$ to terminal 3 of the device output signal terminals, the output signal terminal 4 being coupled to the ground potential. The output signal of amplifier 26 is also coupled through resistor 27 to a second terminal of conducting lead configuration 22'. A first terminal of conducting lead configuration 22' is coupled to a first terminal of conducting lead configuration 22, while second terminal of conducting lead configuration 22 is coupled to the ground potential.

Figure 4:
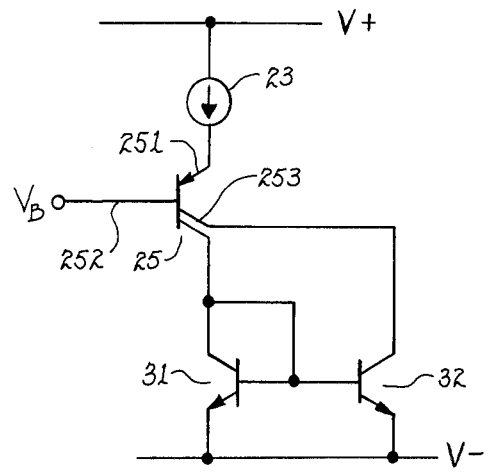
FIG. 4 is a schematic diagram of an electrical equivalent circuit of the Hall effect device of FIG. 3.

Referring next to FIG. 4, the equivalent circuit of the Hall effect device 25 and 25' is shown as PNP split collector transistor 25. The base 252 of transistor 25 is coupled to the voltage supply $V_B$ (as shown in FIG. 3) while the emitter of transistor 25 receives current from current source 23. The transistor 25 is a split-collector transistor and one collector terminal is coupled to the collector of NPN transistor 32 while a second terminal of semiconductor device 25 is coupled to the collector of transistor 31, to the base of transistor 31, and the base of transistor 32. The emitters of transistor 31 and transistor 32 are coupled to the negative supply (V−).

Operation of the Preferred Embodiment

Referring to FIG. 2, the basic operation of the isolation amplifier using a Hall effect device is shown. The conducting lead configuration 21 is a planar conducting coil configuration (shown with one and a half turns) that produces a magnetic field generally perpendicular to the plain of Hall effect device 25. The presence of the current and a perpendicular magnetic field provides a difference of potential in the Hall effect device 25 between terminals 253 and 253'. In equilibrium, i.e. with no magnetic field, the current flowing from terminals 253 and 253' are equal. When the collectors are positioned properly with respect to the magnetic field, the potential difference resulting from the application of the magnetic field results in an imbalance in the current flowing through the two collector terminals. This difference in current flow in the two collector terminal results in an imbalance in the voltage applied to the two terminals of differential amplifier 26. A signal is applied to conducting lead configuration 22 that in turn supplies a magnetic field to the Hall effect device 25, but in the opposite direction from the magnetic field produced by conducting configuration 21. Thus, the input signal $V_{in}$ applied between terminal 2 and terminal 1 will be accurately reflected, because of the large gain of the differential amplifier, in the output signal between terminal 3 and terminal 4 at the output terminals.

As indicated above, in the preferred embodiment, the Hall effect detection device 25 can be viewed as a PNP transistor with a split-collector configuration. The Hall effect resulting from application of a magnetic field, causes a difference in potential between terminals 253 and 253' that results in an imbalance in currents flowing from the two collector terminals. When there is no magnetic field or two magnetic fields compensate, then no voltage is produced between the two terminals of the Hall Effect device and the currents flowing therefrom will be equal.

Referring to FIG. 3, a second embodiment of the present isolation amplifier circuit is shown, in which two Hall Effect devices 25 and 25' are arranged in such a manner that the compensating magnetic fields are reversed for the two devices. Because of this reversal of the configuration, compensation is automatically achieved for the ambient magnetic fields, such as the earth's magnetic field. Comparing the circuit with FIG. 4, the Hall effect device is in effect a PNP transistor with a split-collector configuration. The current flowing from two split-collector terminals of the transistors are applied to a current mirror device comprised of transistors 31 and 32 that maintain the identical current in the two transistors. It will be clear that the input signal can be electrically isolated (or "floating") with respect to the output signal because the coupling between the input and output is by means of the magnetic field. The current mirror circuit including transistor 31 and 32 is provided to enhance the gain for the current differences provided by the magnetic field.

It will be clear that the isolation amplifier of the present invention does not require a power supply on the signal input portion of isolation amplifier, the only power supply required being used for current source 23 (and 23') and operational amplifier 26. It will also be clear to those skilled in the art that the present invention can be readily implemented using monolithic techniques.

The above description is included to illustrate the operation of the preferred embodiment and is not meant to limit the scope of the invention. The scope of the invention is to be limited only by the following claims. From the foregoing description, many variations will be apparent to one skilled in the art that would yet be encompassed by the spirit and scope of the present invention.

What is claimed is:

1. An isolation amplifier comprising:
   first magnetic field means for producing a magnetic field in response to an input signal;
   Hall effect means for producing an induced voltage in response to said magnetic field; and
   second magnetic field means for producing a compensating magnetic field approximately cancelling said magnetic field at said Hall effect means in response to said induced voltage.

2. The isolation amplifier of claim 1 further including amplifier means for amplifying said induced voltage, said amplifier means providing current producing said compensating magnetic field for cancelling said magnetic field.

3. The isolation amplifier of claim 2 further including compensation means, said compensation means including a second first magnetic field means, a second Hall effect means, and a second second magnetic field means; said compensation means for compensating for ambient magnetic field.

4. The isolation amplifier of claim 1 wherein said Hall effect means includes a PNP transistor means having a split-collector configuration, collector terminals of said split-collector for developing a difference current flowing through said collector terminals in response to said magnetic field.

5. The isolation amplifier of claim 4 further including circuit means coupled to said collector terminals for enhancing said difference current.

6. The isolation amplifier of claim 1 wherein said circuit is implemented with monolithic fabrication processes.

7. The isolation amplifier of claim 1 wherein said first magnetic field means and said second magnetic field means include a conducting material generally configured in a loop arrangement.

8. The isolation amplifier of claim 7, wherein said second magnetic field means includes an amplifier for amplifying said induced voltage, said amplifier controlling a current in said second magnetic field means and providing an output signal proportional to said input signal.

9. The method of isolating an input signal from an output signal comprising the steps of:
   producing a magnetic field in a Hall effect device proportional to an input signal;
   utilizing an induced Hall effect signal to provide an output signal; and
   providing a compensating magnetic field in said Hall effect device proportional to said output signal.

10. The method of signal isolation of claim 9 further comprising the step of compensating for ambient magnetic fields.

11. The method of isolating an input signal from an output signal of claim 9 further including the step of fabricating a circuit implementing said method with monolithic techniques.

12. The method of isolating an input signal from an output signal of claim 9 wherein said producing step includes the step of applying a signal to a first conducting region configured in a coil arrangement, and wherein said providing step includes amplifying said output signal and applying said amplifier output signal to a second conducting region configured in a coil arrangement.

13. An isolation amplifier circuit comprising:
   a Hall effect material;
   current means for providing a current flowing through said Hall effect material, a first and a second terminal of said material generally being at the same potential in an absence of a magnetic field;
   magnetic field means for applying a magnetic field to said current means, said magnetic field means causing said first and said second terminal to have a different potential; and
   feedback means coupled to said first and said second terminal for applying a magnetic field to said Hall effect device cancelling said magnetic field means magnetic field, said feedback means for also providing an output signal determined by a magnitude of said cancelling magnetic field.

14. The isolation amplifier circuit of claim 13 further including means for compensation for ambient magnetic fields.

15. The isolation amplifier of claim 13 wherein said ambient magnetic field means includes a second Hall effect material, a second current means and a second magnetic field means for applying a second magnetic field to said second Hall effect material, said second magnetic having a component perpendicular to said second Hall effect material and generally rotated 180° with respect to a component of said magnetic field perpendicular to said Hall effect material, said feedback means also cancelling said second magnetic field.

16. The isolation amplifier circuit of claim 13 wherein said circuit is fabricated as a monolithic circuit.

17. An isolation amplifier comprising:
   a first isolation circuit including:
      a first region of conducting material;
      a Hall effect material having a current flowing therethrough, said Hall effect material having two output terminals, wherein a signal applied to said region causes a magnetic field to be applied to said Hall effect material and a voltage difference to be applied between said output terminals;
      an amplifier having input terminals coupled to said Hall effect material output terminals; and
      a second region of conducting material coupled to an output terminal of amplifier, said second region of conducting material causing a magnetic field in said Hall effect material cancelling said first region magnetic field.

18. The isolation amplifier of claim 17 further including a second isolation circuit, said second isolation circuit positioned with respect to said first isolation circuit to cancel an effect of ambient magnetic fields.

19. The isolation amplifier of claim 17 wherein said Hall effect material is configured as a PNP split-collector transistor, said collectors being coupled to said output terminals.

20. The isolation amplifier of claim 18 wherein said output terminals are coupled to a current mirror circuit.

21. The isolation amplifier of claim 18 fabricated with monolithic technology.

* * * * *